US008280312B2

(12) United States Patent
Boe et al.

(10) Patent No.: US 8,280,312 B2
(45) Date of Patent: Oct. 2, 2012

(54) METHOD AND SYSTEM FOR SIGNAL DISTORTION CHARACTERIZATION AND PREDISTORTION COMPENSATION USING MUTUAL COUPLING IN A RADIO FREQUENCY TRANSMIT/RECEIVE SYSTEM (75) Inventors: Eric N. Boe, Long Beach, CA (US); William L. Lewis, Redondo Beach, CA (US); John Fraschilla, Playa Vista, CA (US)

(73) Assignee: Raytheon Company, Waltham, MA (US)

( * ) Notice: Subject to any disclaimer, the term of this patent is extended or adjusted under 35 U.S.C. 154(b) by 153 days.

(21) Appl. No.: 12/841,383

(22) Filed: Jul. 22, 2010

(65) Prior Publication Data
US 2012/0021691 A1 Jan. 26, 2012

(51) Int. Cl.
*H04B 17/00* (2006.01)

(52) U.S. Cl. .................. 455/67.11; 455/114.2; 455/296; 375/346

(58) Field of Classification Search ............... 455/67.11, 455/114.2, 296; 375/346
See application file for complete search history.

(56) References Cited

U.S. PATENT DOCUMENTS

| 5,493,304 A | 2/1996 | Lee et al. |
| 5,657,023 A | 8/1997 | Lewis et al. |
| 5,682,165 A | 10/1997 | Lewis et al. |
| 5,864,317 A | 1/1999 | Boe et al. |
| 6,751,447 B1 * | 6/2004 | Jin et al. ........... 455/114.3 |
| 7,826,808 B2 * | 11/2010 | Faulkner ........... 455/114.2 |
| 2009/0068965 A1 | 3/2009 | Faulkner |

FOREIGN PATENT DOCUMENTS

WO  WO 01/82499 A2  11/2001

OTHER PUBLICATIONS

Extended European Search Report for European Application No. 11174034.6, Extended European Search Report dated Nov. 2, 2011 and mailed Dec. 5, 2011 (7 pgs.).
Meta, et al., "Signal Processing for FMCW SAR", IEEE Transactions on Geoscience and Remote Sensing, vol. 45, No. 11, Nov. 2007 (pp. 3519-3532).

* cited by examiner

*Primary Examiner* — Tuan H Nguyen
(74) *Attorney, Agent, or Firm* — Christie, Parker & Hale, LLP (57) ABSTRACT

A method and system use the mutual coupling property of multiple antenna elements for characterizing signal waveform distortion introduced by items in the signal path, including the antenna elements, of a radio frequency transmit/receive system. The method and system alleviate the need for external test equipment by using the same hardware used in standard operation of the transmit/receive system for performing waveform distortion characterization through the generation, mutual coupling, and acquisition of a reference signal. In an embodiment involving application of complementary inverse predistortion to generation of an operational signal and/or to processing of a received operational signal, the signal as received and processed during standard system operation is compensated for distortion contributed by system hardware, improving impulse response and system performance.

15 Claims, 4 Drawing Sheets

METHOD AND SYSTEM FOR SIGNAL DISTORTION CHARACTERIZATION AND PREDISTORTION COMPENSATION USING MUTUAL COUPLING IN A RADIO FREQUENCY TRANSMIT/RECEIVE SYSTEM

BACKGROUND OF THE INVENTION

The resolution and scene contrast of an imaging radar system is determined by the system's ability to constrain within a single resolution pixel the primary response of a point target return. Ideally, the return energy from a point scatterer would be contained within one resolution cell with no energy in any other cell, but this would require an infinite observation time window. As a practical compromise, radar systems are designed to maximize the point target return energy within one resolution cell while minimizing the remaining return energy in all other resolution cells. This requires minimization of waveform and pulse distortions occurring within a system's signal paths, as those distortions can cause the return energy to be distributed across multiple resolution cells.

All items in the RF signal path of a radar system may potentially impart phase, amplitude, and time delay distortions on the signal, and the imparted distortion undesirably results in the signal being spread over a broader range of frequencies and time. Several approaches have previously been pursued to reduce this waveform distortion. One approach is simply to specify and manufacture all RF hardware components to such tight tolerances that their total contribution to distortion remains within allowable levels. This is expensive, and does not assure the hardware will meet all requirements under all operating conditions.

Another approach, if the characteristics of the imparted distortion are known in advance of normal operation, is to apply a complementary inverse predistortion factor to the transmission and/or reception of an operational signal in order to compensate for the imparted distortion. The availability of programmable waveform synthesizers in exciters and of digital signal processors in, or associated with, receivers allows such predistortion to be applied, but in order to determine what sort of compensatory factor to apply, the distortion must be characterized and measured in advance. One approach to such distortion measurement involves use of a calibration loopback signal that is generated in the exciter and routed by special distribution circuitry through portions of the antenna RF distribution network and back into the receiver for observation of total generated distortion. This approach can characterize distortion contributed by certain portions of the system's signal path, but cannot characterize distortion contributed by the active circuitry in the antenna's transmit/receive chain, and so tight tolerances must continue to be maintained on all those antenna components. This approach also introduces a new source of distortion, the special distribution circuitry itself.

Another approach involves use of external test and reference signals generated by and/or analyzed by separate system test equipment. This approach may be able to characterize distortion contributed by the antenna transmit/receive chain, but it requires availability of the external system test equipment whenever and wherever calibration is desired, which is impractical for applications such as military and aerospace. This approach also introduces a new source of distortion, the external test equipment itself.

SUMMARY OF THE INVENTION

Embodiments of the present invention feature a novel approach to characterizing and compensating for signal path distortion, leveraging two characteristics often found in RF transmit/receive systems using electronically scanned array or "ESA" antennas, and other systems as well. First, these systems often possess the ability simultaneously to transmit signals from their transmitting electronics and antenna radiating elements while receiving signals through their antenna receiving elements and receiving electronics. Second, these systems display the phenomenon known as "mutual coupling" among multiple antenna elements, wherein a portion of the signal being transmitted from a radiating element is coupled directly back into a receiving element. This phenomenon has often been considered a nuisance, but embodiments of the present invention turn the mutual coupling phenomenon to their advantage for characterizing signal path distortion and using this characterization to generate complementary inverse predistortion, thus achieving improved impulse response and system performance without the need for dedicated external test and measurement equipment.

Embodiments of the present invention use mutual coupling to convey a portion of the transmitted energy immediately back into the system receive path where it can be captured and analyzed, and from those results a set of predistortions can be calculated and fed back into the exciter's waveform generator and/or signal processors in the receiver or elsewhere in the receive and processing chain. The resulting predistortion compensations correct for observed distortion contributed by any and all items in the system's transmit and receive signal path, including its antenna transmitting and receiving elements, allowing for much higher precision of waveform predistortion and thus higher quality imagery. The present invention's use of the system's own operational hardware to generate, transmit, receive, acquire and process the reference and calibration signal eliminates the need for external test equipment, and also eliminates the additional error introduced by using external hardware to generate or analyze the reference signal.

According to one embodiment, the present invention is directed to a method for characterizing distortion in a radio frequency transmit/receive system. In this method, a radio frequency reference signal is generated, that signal is transmitted through a transmission path that is also usable for transmitting an operational signal, and received through a receiving path that is also usable for receiving an operational signal. That signal is also propagated through a mutual coupling field from an antenna radiating element to an antenna receiving element, which elements are also usable with an operational signal. The signal is also acquired and analyzed to determine a difference between a reference waveform (e.g., a predistorted signal as transmitted, or an idealized waveform without application of transmit-side predistortion) and a waveform of the received reference signal or derivative thereof (e.g., the received signal after additional processing) as acquired from mutual coupling.

According to other embodiments, the method further includes determining a predistortion compensation that tends to decrease at least one aspect of a difference between a reference waveform and a waveform of the received reference signal or derivative thereof as acquired from mutual coupling. According to one of those embodiments, the method further includes applying the determined predistortion compensation to at least one of generation of an operational signal or processing of a received operational signal. According to other of those embodiments, the method includes applying the determined predistortion compensation to a reference signal, propagating the predistorted reference signal through the system, and determining a difference between a reference waveform and a waveform of the received reference signal or derivative thereof as acquired from mutual coupling. According to one of those embodiments, the method further includes at least once iteratively repeating the determination of a predistortion compensation that tends to decrease at least one aspect of a difference between a reference waveform and a waveform of the received reference signal or derivative thereof as acquired from mutual coupling, applying said iteratively determined predistortion compensation to at least one of generation of an iterative reference signal or processing of a received iterative reference signal, propagating said iteratively predistorted reference signal through the system, and determining a difference between a reference waveform and a waveform of the received iterative reference signal or derivative thereof as acquired from mutual coupling.

According to another embodiment, the path over which the reference signal propagates through the system after being generated and before being acquired is, disregarding any path between the antenna radiating element and the antenna receiving element, substantially the same as a path over which an operational signal propagates through the system after being generated and before being acquired.

According to one embodiment, a waveform of the reference signal or derivative thereof (e.g. such a waveform with any transmit-side predistortion applied) is used as a waveform of the operational signal. According to another embodiment, the reference signal selected for use comprises a waveform that emphasizes at least one aspect of a difference between a reference waveform and a waveform of the received reference signal or derivative thereof as acquired from mutual coupling.

According to another embodiment, the method further includes at least once changing the signal path through the system, and generating another radio frequency reference signal. That signal is transmitted through a transmission path that is also usable for transmitting an operational signal, and received through a receiving path that is also usable for receiving an operational signal. That signal is also propagated through a mutual coupling field from an antenna radiating element to an antenna receiving element, which elements are also usable with an operational signal. The signal is also acquired and analyzed to determine a difference between a reference waveform and a waveform of the received signal or derivative thereof as acquired from mutual coupling, and the system determines an ensemble average of the differences associated with each of a plurality of signal paths between one or more reference waveforms and a waveform of a received signal or derivative thereof as acquired from mutual coupling.

According to one embodiment, the present invention is directed to a radio frequency transmit/receive system comprising an exciter capable of producing a radio frequency reference signal, a transmit side comprising at least one transmitting signal path comprising an antenna radiating element, which transmitting signal path and antenna radiating element are usable for transmitting operational signals, a receive side comprising at least one receiving signal path comprising an antenna receiving element, which receiving signal path and antenna receiving element are usable for receiving operational signals, wherein at least one antenna receiving element is disposed in the mutual coupling field of at least one antenna radiating element, a signal receiver capable of acquiring a signal, and circuitry configured to determine a difference between a reference waveform and a waveform of a received signal or derivative thereof as acquired from mutual coupling.

According to other embodiments, the system includes circuitry configured to determine a predistortion compensation that tends to decrease at least one aspect of the determined difference between a desired waveform and a waveform as acquired from mutual coupling. According to one of those embodiments, the system further includes application circuitry configured to apply the determined predistortion compensation to the generation of a signal waveform.

According to another embodiment, the system includes a plurality of signal paths, and circuitry is configured to determine an ensemble average of the differences associated with each of a plurality of signal paths between one or more reference waveforms and a waveform of a received signal or derivative thereof as acquired from mutual coupling.

DETAILED DESCRIPTION

Embodiments in accord with the present invention are directed to a method and system for a radio frequency transmit/receive system that uses a reference signal and takes advantage of the mutual coupling property of multiple antenna elements to characterize signal distortion introduced by various signal paths, including the electronics and other items in those signal paths which are also traversed by an operational signal between its generation and its reception during normal operation of the system, determines complementary inverse predistortions to compensate for the characterized distortion, and applies that compensation to the transmit-side and/or receive-side signal chains. The generation and acquisition of the reference signal are performed by the same exciter and receiver, respectively, as are used for normal operation, permitting the aspects of signal distortion to be characterized without the need for dedicated external test and measurement equipment.

Figure 1:
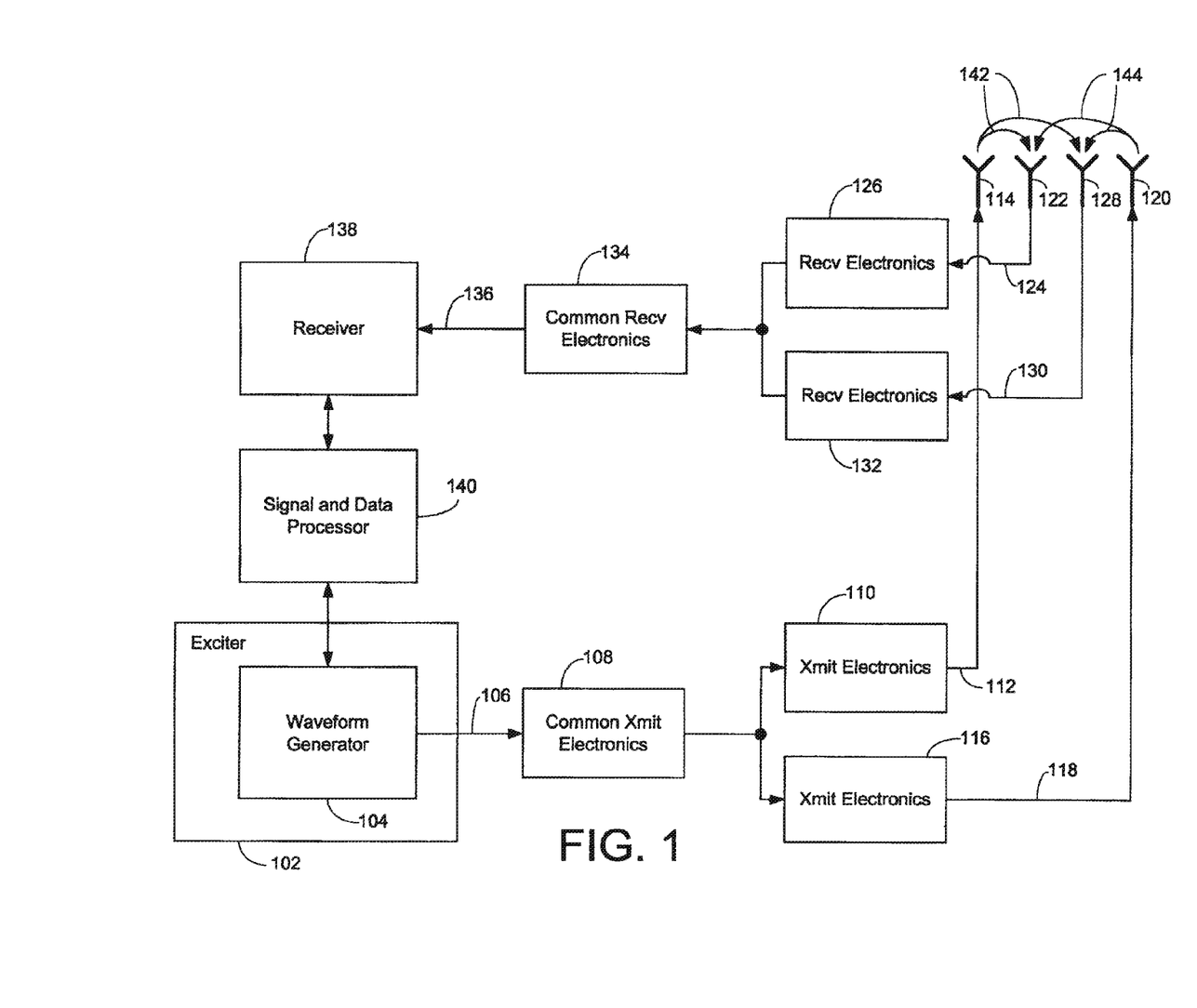
FIG. 1 is a schematic view of a radio frequency transmit/receive system according to the present invention.

In an embodiment in accord with the present invention, as depicted in FIG. 1, the transmit side of the transmit/receive system includes an exciter 102 containing a waveform generator 104. The exciter and its waveform generator are connected to common transmitting signal path 106 including any common transmit electronics 108 in that signal path. The transmit side signal path may connect into multiple transmitting signal paths driving various antenna radiating elements, of which two exemplars are shown in FIG. 1, transmitting electronics 110 and transmit signal path 112 connecting to antenna radiating element 114, and transmitting electronics 116 and transmitting signal path 118 connecting to antenna radiating element 120. The receive side of the system includes at least one and may include multiple receiving signal paths fed from various antenna receiving elements, of which two exemplars are shown in FIG. 1, antenna receiving element 122 connected to receiving signal path 124 and receiving electronics 126, and antenna receiving element 128 connected to receiving signal path 130 and receiving electronics 132. The multiple receiving signal paths and electronics connect to any common receiving electronics 134 and common receiving signal path 136, which in turn connect to signal receiver 138. The signal receiver in turn connects to a signal and data processor 140, which connects to the waveform generator 104 in exciter 102. The antenna receiving elements are disposed in mutual coupling field 142 of the first antenna radiating element 114 and mutual coupling field 144 of the second antenna radiating element 120. Although two transmit-side and two receive-side signal paths are depicted in FIG. 1, additional signal paths beyond two may be attached to either the transmit side or the receive side, with their respective antenna elements also disposed within the mutual coupling field or fields.

The terms "attached," "connected," "connecting," "driving," "feed" or "fed" as used here may include any form of the two referenced items being in communication with each other, such as direct or indirect electrical, electronic, optical, RF, or waveguide connection, or any other form of attachment or association that promotes signal or data communication. It should also be noted that the exciter, receiver, signal and data processor, and other electronics and/or modules may be implemented in and operate in the analog and/or digital domain, using specialized electrical and/or optical circuitry and/or mechanical members, special purpose computers, ASICs and/or firmware, and/or general purpose computers programmed with special purpose software.

Figure 2:
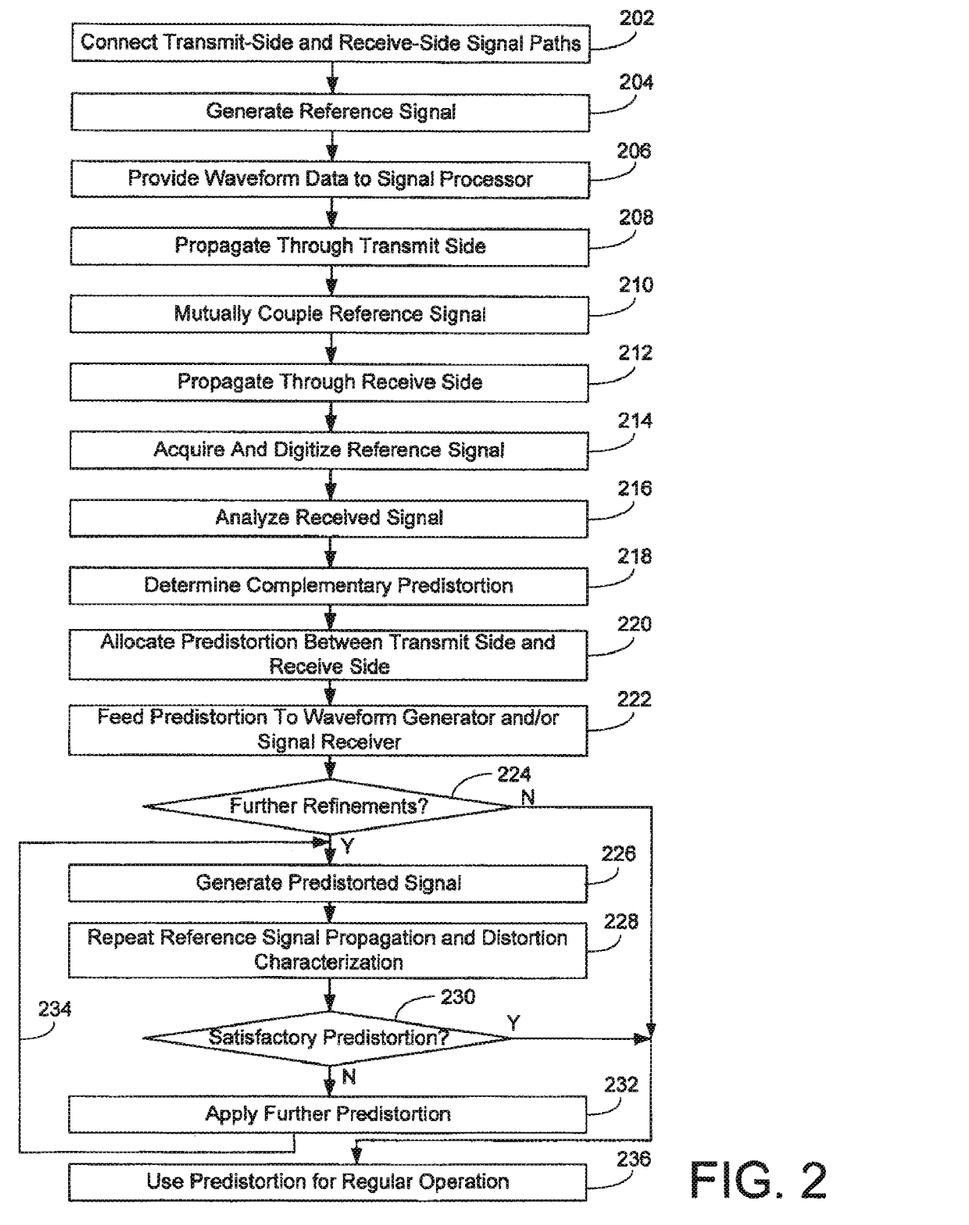
FIG. 2 is a flow chart outlining a method according to the present invention for characterizing the distortion contributed by items in the signal path and determining and applying complementary inverse predistortion to compensate for such characterized distortion.

According to one embodiment of a method for implementing the present invention in a radio frequency transmit/receive system, as depicted in FIG. 2, transmit-side signal path and electronics 110, 112 and receive-side signal path and electronics 124, 126 are connected (202) to the exciter and signal receiver, respectively, or otherwise enabled to propagate a signal. An initial, idealized, high-resolution reference signal is generated (204) by waveform generator 104 within exciter 102. If not already known to the data and signal processor 140, data regarding the waveform of the signal as generated is provided (206) to the data and signal processor 140. The reference signal is propagated (208) through the signal paths 106, 112 on the transmit side of the system, including any electronics 108, 110 in those paths, and to associated antenna radiating element 114. The majority of the signal is radiated into space, but a small portion is mutually coupled (210) through mutual coupling field 142 into other elements in the antenna such as antenna receiving elements 122 and 128. The mutually coupled signal is then propagated (212) through signal paths 124, 136 on receive side of the system, including any electronics 126, 134 in those signal paths. The signal propagates to signal receiver 138 where it is acquired and digitized (214) by the receiver. The digitized acquired signal is provided to signal and data processor 140, where its waveform is compared with the waveform of the signal as transmitted and otherwise analyzed (216) to characterize differences, that is, aspects of distortion, for example phase distortion, amplitude distortion, and time delay, that have been introduced by various items of hardware and electronics, including the antenna elements, located in the system's transmit-side and receive-side signal paths.

It should be noted that either the signal receiver 138, the signal and data processor 140, or any other processing module or circuitry may first process the acquired signal, whether with previously determined compensatory predistortion or with any other amending factors, before submitting it for such characterization of distortion. It should also be noted that the acquired signal, either with or without additional signal processing, may be compared to any number of reference waveforms. It could, for example, be compared to the waveform of the transmit signal with any compensating predistortion or other transmit-side amending factors applied. It could, for another example, be compared to the waveform of an "original" or idealized transmit signal without any compensating predistortion or other transmit-side amending factors applied.

Using the comparison, the processor determines (218) a set of complementary inverse predistortion characteristics to compensate for the distortion observed. It allocates (220) which portions of the predistortion characteristics to implement on the transmit side and which portions to implement on the receive side. It feeds (222) the predistortion characteristics to be implemented on the transmit side into the waveform generator within the exciter for construction of a modified signal waveform incorporating those predistortion characteristics, and also feeds the predistortion characteristics to be implemented on the receive side into the signal receiver or other modules in the receive or data processing chain in order to alter the characteristics of signal processing that those modules apply to received signals. The resultant transmit-side and receive-side predistortions may be used for normal operation (236).

Alternatively, if further refinements in the distortion compensation are desired (224), once a distortion characterization has been performed and appropriate predistortion applied to the transmit side and/or receive side, a modified, predistorted reference signal modified by appropriate predistortion is generated (226) and the reference signal propagation and distortion characterization are repeated (228) to determine (230) whether the predistortion compensation has been successful and the modified signal as received and processed displays the desired characteristics. If not, further predistortion may be applied to the transmit side and/or the receive side (232). This process of distortion characterization and predistortion compensation may be further iteratively repeated (234) to refine the predistortion compensation until satisfactory, and the predistortion compensation as refined may then be applied to normal operation (236).

The distortion introduced by the system signal path appears in the acquired signal in the form of differences from the signal as transmitted. In most cases these differences will have some non-zero dimension and magnitude, representing the introduced distortion. The purpose of applying complementary inverse predistortion to signal generation and received signal processing is thus to counteract and reduce as nearly to zero as practical or desired the differences between the signal as acquired and processed and the non-predistorted original signal. By random chance occasionally upon initial characterization, or after application of predistortion as discussed above, these differences may be observed to be of zero or near-zero magnitude, or at least, of a magnitude small enough to be acceptable. This permits use of a received, processed signal similar to the signal that would have been obtained with an uncompensated signal had the signal path not contributed any distortion.

Figure 4A:
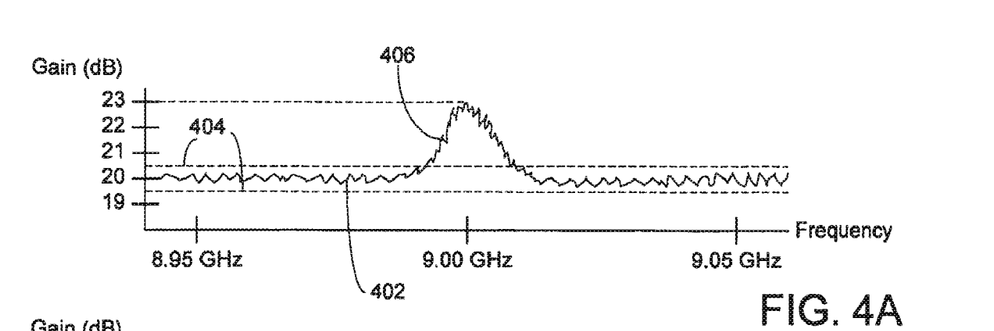
FIG. 4 is a set of gain versus frequency plots showing an uncompensated signal return profile, a transmit-side predistortion applied to that signal, a receive-side predistortion applied to that signal, and the resulting compensated signal profile.
Figure 4B:
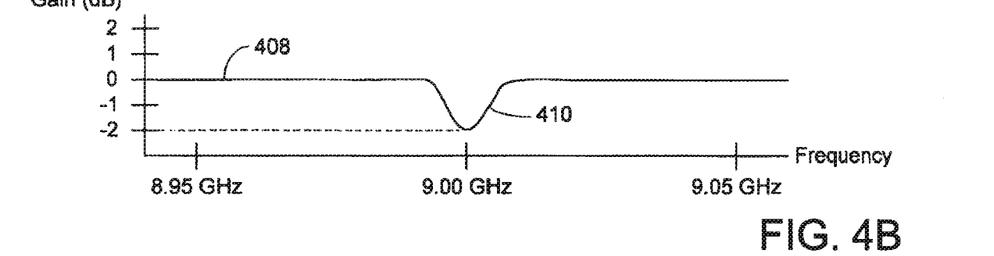
Figure 4C:
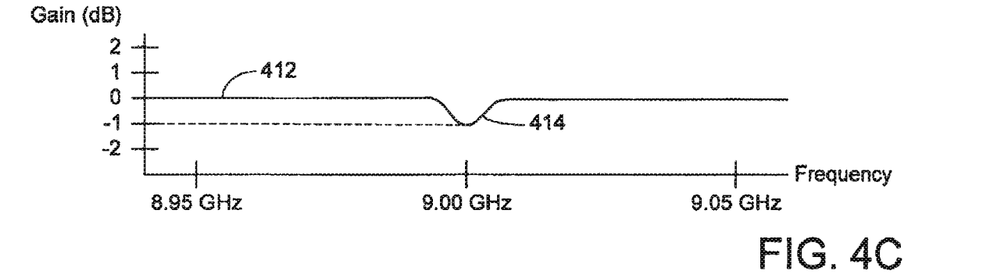
Figure 4D:
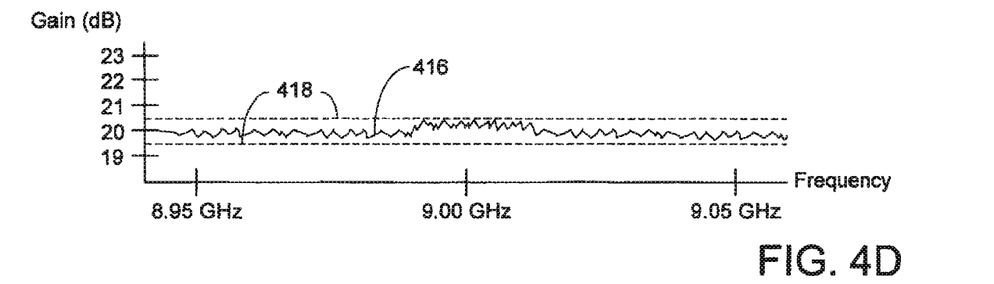

The aspects of distortions to be compensated for may include any type or domain, for example those related to amplitude, frequency, frequency-dependent phase, or absolute time delay. Multiple aspects or distortions may be characterized and compensated for simultaneously. One simple example of a distribution introduced by a system to which transmit-side and receive-side complementary inverse predistortion is applied is depicted in FIG. 4. The system in this sample has a center frequency of 9 GHz and a frequency excursion of ±50 MHz, and a gain linearity requirement over the relevant frequency range of ±0.5 dB. A plot of gain versus frequency observed for an uncompensated signal return in an uncalibrated system is depicted in FIG. 4A. In this example, the observed gain 402 remains mostly within the permitted gain linearity boundaries 404, between 19.5 and 20.5 dB. However, near the center frequency the gain suffers an excursion 406 outside the permitted boundaries, rising to 23 dB. Once this zone of excess gain has been characterized, complementary inverse predistortions are, in this example, applied on both the transmit side and receive side. The transmit-side predistortion is depicted in FIG. 4B. The predistortion gain 408 to be imposed on the generated signal is mostly neutral at 0 dB, but in the frequency range where the observed gain 402 suffers the excursion 406 outside the permitted range 404, a counter-excursion of decreasing gain 410 down to −2.0 dB is imposed on the signal as transmitted. The receive-side predistortion is depicted in FIG. 4C. The predistortion gain 412 to be applied to processing of the received signal is mostly neutral at 0 dB, but in the frequency range where the observed gain 402 suffers the excursion 406 outside the permitted range 404, a counter-excursion of decreasing gain 414 down to −1.0 dB is applied to the received signal during signal processing. The combined effects on the distorted signal of the transmit-side and receive-side predistortions are depicted in FIG. 4D. The observed compensated gain profile 416 no longer includes an excursion outside the permitted gain linearity boundaries 418. The uncompensated +3.0 dB gain excursion near the center frequency has been decreased 2.0 dB by the transmit-side predistortion and another 1.0 dB by the receive-side predistortion, minimizing or eliminating the gain excursion.

Figure 3:
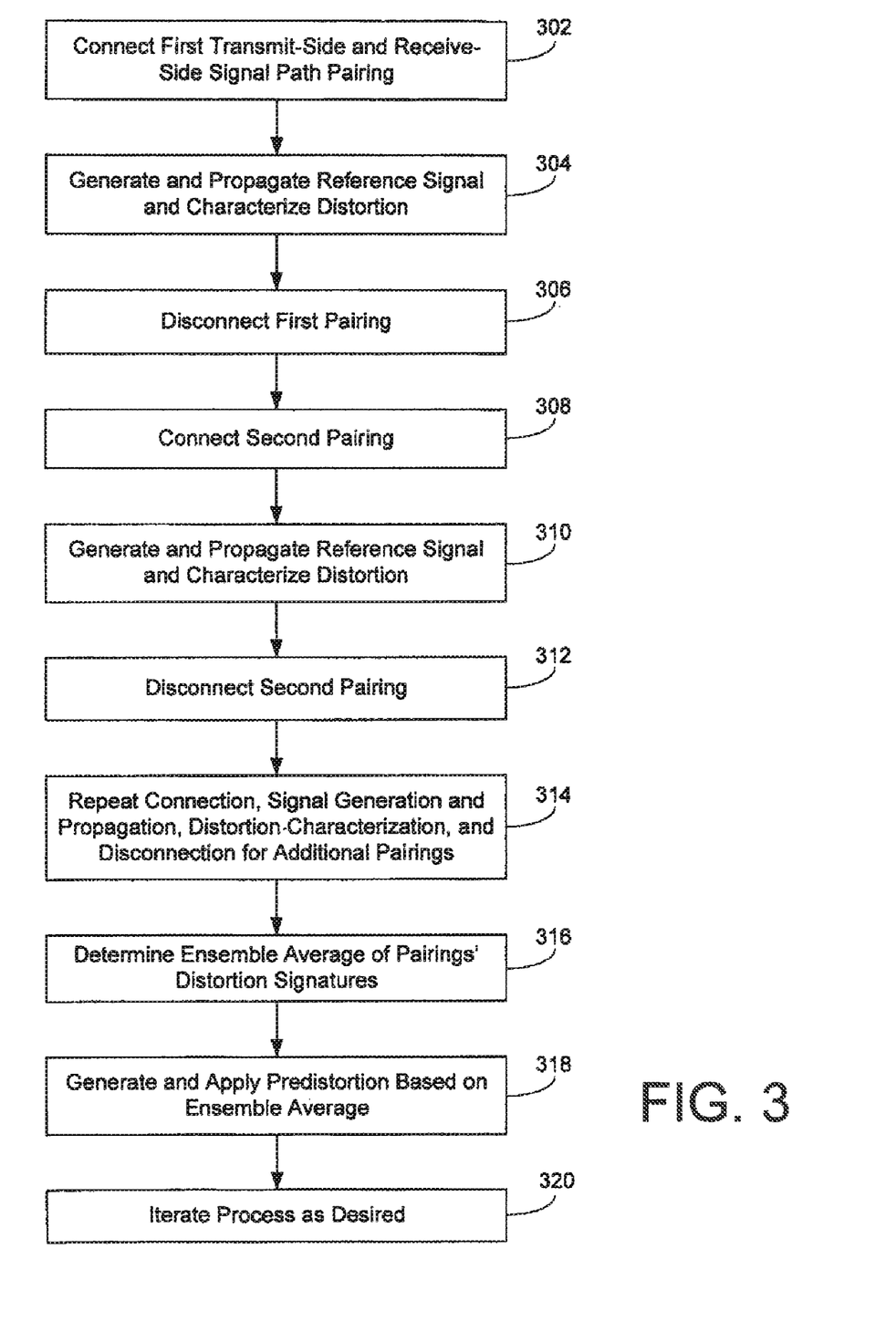
FIG. 3 is a flow chart outlining a method according to the present invention for characterizing the distortion contributed by items in various transmit-receive signal path pairings in a system possessing a plurality of such pairings, and determining and applying complementary inverse predistortion based on the ensemble average of such characterized distortions.

Modern ESA systems employ antennas featuring multiple radiating elements and receiving elements. As depicted in FIG. 1, each of these antenna elements may be associated with a unique signal path or signal path portion which may also contain separate electronics or other hardware. Each of these signal paths and antenna elements may introduce its own unique distortion signature into a signal propagated through it. In order to characterize the distortion signature of a multi-element antenna as a whole, in another embodiment of the present invention the distortion characterization process may be repeated for various transmit paths and receive paths selected for propagation of the reference signal through those various transmit-receive path pairings, and the distortion signatures of those various pairings characterized. According to this embodiment, as depicted in FIG. 3, a first pairing of transmitting and receiving signal paths, for example transmitting signal path and electronics 110, 112, antenna radiating element 114, receiving signal path and electronics 124, 126, and antenna receiving element 122, is connected or otherwise engaged (302), and a reference signal is generated and propagated through the system and the distortion is characterized (304) for the system signal path involving that first pairing. The first pairing is disconnected or otherwise disengaged (306), and a second signal-path pairing is connected or otherwise engaged (308), for example transmitting signal path and electronics 116, 118, antenna radiating element 120, alternative receiving signal path and electronics 130, 132, and antenna receiving element 128. A reference signal is generated and propagated through the system and the distortion is characterized (310) for the system signal path involving that second pairing. The second pairing may be disconnected (312), and the process of connection, reference signal generation and propagation, distortion characterization, and disconnection may be repeated (314) for as may additional signal path pairings as desired. An ensemble average of the observed signal distortion signatures of all the various pairings is determined (316), and the signal processor generates, allocates and applies (318) complementary inverse predistortion to the transmit side and/or the receive side based on that ensemble average. As with the process involving the single transmit-receive pairing discussed above, this process involving multiple transmit-receive pairings may be iteratively repeated (320), either iterated on a pairing-by-pairing basis, or iterated involving the ensemble average, to refine the applied predistortion.

It should be noted that the above actions in any of the discussed embodiments need not necessarily be performed in the exact order discussed here.

In one embodiment in accordance with the present invention, the reference signal waveform being used for distortion characterization may be the waveform of the operational signal itself. In another embodiment, the reference signal waveform may be a specially devised test waveform selected to easily and clearly demonstrate and expose a particular aspect of signal response and distortion. Although in such an embodiment predistortions may be applied to subsequent propagations of such test waveform for purposes of iteratively refining the predistortion to be applied, in normal operation the determined predistortion is applied to the operational signal rather than the test signal.

One benefit of the embodiments according to the present invention is that the distortion characterization and compensating predistortion process requires no significant reconfiguration of or addition to the standard operational transmit/receive hardware, only the transmission of a reference signal if desired instead of an operational signal and perhaps a slight, temporary reconfiguration of the signal flows through the system. The signal processing abilities called for in the signal and data processor by embodiments of this invention do not markedly exceed or differ from those abilities required by normal radar signal processing.

Further, the characterization and predistortion process is very brief and occupies only a very small portion of the operational duty cycle of the system. The process can thus be performed periodically during normal operations, such as once every few seconds. The process can also be performed on demand, such as when the performance of the system is detected to be shifting or degrading, or upon manual command of a system operator.

Although limited embodiments of the present invention have been specifically described and illustrated, many modifications, combinations, and variations will be apparent to those skilled in the art. Accordingly, it is to be understood that a radio frequency transmit/receive system constructed and a distortion characterization and compensation method practiced according to the principles of this invention may be embodied other than as specifically described herein. The invention is also defined in the following claims.

What is claimed is:

1. A method for characterizing distortion in a radio frequency transmit/receive system, comprising:
generating a radio frequency reference signal by a signal generator;
transmitting the radio frequency reference signal through a transmission path that is also usable for transmitting a first operational signal;
receiving the radio frequency reference signal through a receiving path that is also usable for receiving a second operational signal;
mutually coupling the radio frequency reference signal from an antenna radiating element to an antenna receiving element, wherein the antenna radiating and receiving elements are also usable with respectively the first and second operational signals; and determining a difference between a reference waveform associated with the transmitted radio frequency reference signal, and a waveform of the received radio frequency reference signal or derivative thereof as acquired from the mutual coupling;

determining a predistortion compensation based on the determined difference; and generating by the signal generator a second signal implementing the predistortion compensation.

2. The method of claim 1, wherein the predistortion compensation is configured to decrease at least one aspect of the difference between the reference waveform and the waveform of the received radio frequency reference signal or derivative thereof as acquired from the mutual coupling.

3. The method of claim 1, further comprising applying the determined predistortion compensation to at least one of generation of the first operational signal or processing of the received second operational signal.

4. The method of claim 1, further comprising applying the determined predistortion compensation to at least one of generation of a second reference signal or processing of a received second reference signal, propagating the second reference signal through the system, and determining a difference between a second reference waveform and a waveform of the received second reference signal or derivative thereof as acquired from mutual coupling.

5. The method of claim 1, further comprising at least once iteratively repeating determining the predistortion compensation configured to decrease at least one aspect of a difference between a reference waveform and a waveform of the received reference signal or derivative thereof as acquired from mutual coupling, applying said iteratively determined predistortion compensation to at least one of generation of an iterative reference signal or processing of a received iterative reference signal, propagating said iterative reference signal through the system, and determining a difference between a reference waveform and a waveform of the received iterative reference signal or derivative thereof as acquired from mutual coupling.

6. The method of claim 1, wherein the path over which the radio frequency reference signal propagates through the system after being generated and before being acquired is, disregarding any path between the antenna radiating element and the antenna receiving element, substantially the same as a path over which the first operational signal propagates through the system after being generated and before being acquired.

7. The method of claim 1, further comprising using a waveform of the radio frequency reference signal or derivative thereof as a waveform of the first operational signal.

8. The method of claim 1, further comprising selecting for use a second reference signal comprising a second waveform that emphasizes at least one aspect of a difference between the reference waveform associated with the transmitted radio frequency reference signal, and the waveform of the received radio frequency reference signal or derivative thereof as acquired from the mutual coupling.

9. The method of claim 1, wherein the predistortion compensation is configured to decrease at least one aspect of the difference between the reference waveform associated with the transmitted radio frequency reference signal, and the waveform of the received radio frequency reference signal.

10. A method for characterizing distortion in a radio frequency transmit/receive system, comprising:

generating a first radio frequency reference signal;

transmitting the first radio frequency reference signal through a first transmission path that is also usable for transmitting a first operational signal;

receiving the first radio frequency reference signal through a first receiving path that is also usable for receiving a second operational signal;

mutually coupling the first radio frequency reference signal from an antenna radiating element to an antenna receiving element, wherein the antenna radiating and receiving elements are also usable with respectively the first and second operational signals;

acquiring and analyzing the first radio frequency reference signal to determine a first difference between a first reference waveform and a first waveform of the received first radio frequency reference signal or derivative thereof as acquired from the mutual coupling;

at least once changing the signal path through the system;

generating a second radio frequency reference signal;

transmitting the second radio frequency reference signal through a second transmission path that is also usable for transmitting a third operational signal;

receiving the second radio frequency reference signal through a second receiving path that is also usable for receiving a fourth operational signal;

mutually coupling the second radio frequency reference signal from the antenna radiating element to the antenna receiving element, wherein the antenna radiating and receiving elements are also usable with respectively the third and fourth operational signals;

acquiring and analyzing the second radio frequency reference signal to determine a second difference between a second reference waveform and a second waveform of the received second radio frequency reference signal or derivative thereof as acquired from the mutual coupling; and determining an ensemble average of the first and second differences associated with respectively the first and second signal paths.

11. A radio frequency transmit/receive system, comprising:

an exciter capable of producing a radio frequency reference signal;

an antenna radiating element in a transmitting signal path for transmitting first operational signals and the radio frequency reference signal;

an antenna receiving element in a receiving signal path for receiving second operational signals and for mutually coupling the transmitted radio frequency reference signal from the antenna radiating element; and circuitry coupled to the exciter for determining a difference between a reference waveform associated with the transmitted radio frequency reference signal, and a waveform of the received radio frequency reference signal or derivative thereof as acquired from the mutual coupling, the circuitry being further configured to determine a predistortion compensation based on the determined difference, wherein, the exciter is configured to generate a second signal implementing the predistortion compensation.

12. The system of claim 11, wherein the predistortion compensation is configured to decrease at least one aspect of the difference between the reference waveform and the waveform of the received reference signal or derivative thereof as acquired from the mutual coupling.

13. The system of claim 11, wherein the circuitry is configured to apply the determined predistortion compensation to at least one of generation of a signal or processing of a received signal.

14. A radio frequency transmit/receive system, comprising:
   an exciter capable of producing a radio frequency reference signal;
   an antenna radiating element in a transmitting signal path for transmitting first operational signals and the radio frequency reference signal;
   an antenna receiving element in a receiving signal path for receiving second operational signals and for mutually coupling the transmitted radio frequency reference signal from the antenna radiating element, wherein the antenna receiving element is disposed in proximity to the antenna radiating element for permitting mutual coupling; and
   circuitry configured to determine a difference between a reference waveform and a waveform of a received signal or derivative thereof as acquired from mutual coupling, the circuitry being further configured to determine an ensemble average of the differences associated with each of a plurality of signal paths between one or more reference waveforms and a waveform of a received signal or derivative thereof as acquired from mutual coupling.

15. A method for characterizing distortion in a radio frequency transmit/receive system, comprising:
   generating a first radio frequency reference signal;
   transmitting the first radio frequency reference signal through a transmission path that is also usable for transmitting a first operational signal;
   receiving the first radio frequency reference signal through a receiving path that is also usable for receiving a second operational signal;
   mutually coupling the first radio frequency reference signal from an antenna radiating element to an antenna receiving element, wherein the antenna radiating and receiving elements are also usable with respectively the first and second operational signals;
   acquiring and analyzing the first radio frequency reference signal to determine a first difference between a first reference waveform and a first waveform of the received first radio frequency reference signal or derivative thereof as acquired from the mutual coupling;
   determining a predistortion compensation that is configured to decrease at least one aspect of the first difference between the first reference waveform and the first waveform of the received first radio frequency reference signal or derivative thereof as acquired from the mutual coupling;
   applying the determined predistortion compensation to at least one of generation of a second reference signal or processing of a received second reference signal;
   propagating the second reference signal through the system;
   determining a second difference between a second reference waveform and a waveform of received second reference signal or derivative thereof as acquired from mutual coupling;
   at least once iteratively repeating determining the predistortion compensation configured to decrease at least one aspect of a difference between a reference waveform and a waveform of the received reference signal or derivative thereof as acquired from mutual coupling;
   applying said iteratively determined predistortion compensation to at least one of generation of an iterative reference signal or processing of a received iterative reference signal;
   propagating said iterative reference signal through the system; and
   determining a third difference between a reference waveform and a waveform of the received iterative reference signal or derivative thereof as acquired from mutual coupling.

* * * * *